US006586896B2

(12) United States Patent
Menegoli

(10) Patent No.: US 6,586,896 B2
(45) Date of Patent: Jul. 1, 2003

(54) METHOD AND APPARATUS FOR IMPROVED TRANSITION FROM PULSE WIDTH MODULATION TO LINEAR CONTROL

(75) Inventor: Paolo Menegoli, San Jose, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/774,824

(22) Filed: Jan. 30, 2001

(65) Prior Publication Data

US 2001/0009357 A1 Jul. 26, 2001

Related U.S. Application Data

(60) Continuation of application No. 09/435,127, filed on Nov. 5, 1999, now Pat. No. 6,201,366, which is a division of application No. 08/956,837, filed on Oct. 23, 1997, now Pat. No. 5,994,856.

(51) Int. Cl.[7] .............................. H03F 3/45; H02P 6/00
(52) U.S. Cl. ...................................... 318/254; 330/261
(58) Field of Search ................................ 318/138, 254, 318/439, 459, 500, 590; 388/928.1; 330/250, 252, 255, 257, 261, 262, 263, 267, 273, 288, 296

(56) References Cited

U.S. PATENT DOCUMENTS

| | | | | |
|---|---|---|---|---|
| 4,290,000 A | * | 9/1981 | Sun | 318/566 |
| 4,384,243 A | * | 5/1983 | Muskovac | 318/729 |
| 4,825,132 A | * | 4/1989 | Gritter | 318/811 |
| 4,999,552 A | * | 3/1991 | Seipelt | 318/434 |
| 5,194,824 A | | 3/1993 | Wu et al. | 330/255 |
| 5,221,881 A | | 6/1993 | Cameron | 318/254 |
| 5,231,338 A | | 7/1993 | Bulgarelli et al. | 318/254 |
| 5,306,988 A | | 4/1994 | Carbolante et al. | 318/254 |
| 5,317,243 A | | 5/1994 | Cameron | 318/254 |
| 5,319,290 A | | 6/1994 | Yoshino et al. | 318/254 |
| 5,572,096 A | | 11/1996 | Schlager | 318/254 |
| 5,723,963 A | | 3/1998 | Li et al. | 318/590 |
| 5,731,670 A | | 3/1998 | Galbiati et al. | 318/254 |

OTHER PUBLICATIONS

"TPA4860, TPA4860Y, 1–Watt Audio Power Amplifier," *Texas Instruments, Inc.* © 1996, (SLOS 164), Sep. 1996, p. 2–41.
"Sleep–Mode™ Two–State, Micropower Operational Amplifier," *Motorola, Inc.* © 1996, MC33102, pp. 1–2.
"TPA302, TPA302Y, 300–mW Stereo Audio Power Amplifier," *Texas Instruments, Inc.* © 1997, (SLOS 174A), Jan. 1997—Revised Mar. 1997, p. 2–9.
Sedra, Adela S. et al., "Microelectronic Circuits," Fourt Edition, Oxford University Press, 1998, pp. 603, 658, 704, 736, 1172–75, 1220.

* cited by examiner

Primary Examiner—Bentsu Ro
(74) Attorney, Agent, or Firm—David V. Carlson; Lisa K. Jorgenson

(57) ABSTRACT

A method and a circuit for switching a motor controller from pulse width modulation to linear control for a brush-less, sensor-less, poly-phase DC motor. The method includes steps of operating a drive circuit for a poly-phase direct current motor in a pulse width modulation mode and determining that a zero crossing will occur within a predetermined interval. The method also includes steps of enabling a bias current to a transconductance operational amplifier and changing an operating state of the drive circuit from the pulse width modulation mode to a linear mode. The method further includes steps of determining that the zero crossing has occurred, disabling the bias current to the transconductance operational amplifier and changing the operating state of the drive circuit from the linear mode to the pulse width modulation mode.

19 Claims, 4 Drawing Sheets

METHOD AND APPARATUS FOR IMPROVED TRANSITION FROM PULSE WIDTH MODULATION TO LINEAR CONTROL

CROSS-REFERENCE TO RELATED APPLICATION

This application claims priority benefit under 35 U.S.C. §120 based on U.S. patent application Ser. No. 08/956,837, filed on Oct. 23, 1997, now issued as U.S. Pat. No. 5,994,856. This application also claims priority benefit under 35 U.S.C. §120 based on U.S. Patent Application Ser. No. 09/435,127, filed Nov. 5, 1999, now issued as U.S. Pat. No. 6,201,366. This application is a continuation of U.S. patent application Ser. No. 09/435,127, filed Nov. 5, 1999, now issued as U.S. Pat. No. 6,201,366; which was a divisional of U.S. patent application Ser. No. 08/956,837, filed Oct. 23, 1997, now issued as U.S. Pat. No. 5,994,856.

TECHNICAL FIELD

This invention relates to the operation of a poly-phase DC motor, and more particularly, to a method and a circuit for rapidly and reliably switching from pulse width modulation mode to linear control mode for operation of a poly-phase DC motor.

BACKGROUND OF THE INVENTION

Poly-phase DC motors, and more particularly three-phase DC motors of the brush-less, sensor-less type, are widely used in computer system disk drives, such as floppy disk, hard disk, or CD ROM drives, as well as in other applications. Such motors can be driven in two different control modes: pulse width modulation or linear.

In many systems, there is need to switch between pulse-width modulation control mode to linear control mode. In some applications, this switching is done once per revolution of the motor. In other applications, the control mode is switched several times per revolution. In still other applications, the motor is primarily driven in linear mode and occasionally in pulse width modulation mode. Frequently, this switching occurs at a selected time in the revolution of the motor. Often, the selected time is when the voltage induced in the coil that is floating, i.e., the back EMF voltage, exhibits a zero crossing point.

One problem encountered with switching from PWM control mode to linear control mode is that linear control circuitry requires a finite time to stabilize after switching to achieve reliable operation. This settling period is in part because the bias circuit of the linear control circuitry tends to partially discharge while the controller is operating in pulse width modulation mode, and requires time to be recharged to an appropriate voltage.

SUMMARY OF THE INVENTION

In a first embodiment, the present invention includes a circuit having a differential input amplifier having a first input responsive to a first voltage, a second input responsive to a second voltage and having an output coupled to a first node. The circuit also includes a transconductance operational amplifier having an input responsive to voltage signals coupled to the node and an output providing a voltage signal. A bias circuit is coupled from a power supply lead to disable the differential input amplifier and the transconductance operational amplifier and providing a high DC impedance at the first node in response to a control signal.

A drive circuit provides power to a motor in a linear mode. At a selected time, the drive circuit transitions from the linear mode of operation to a pulse width modulation mode of operation for providing power to the motor. When the circuit is in the pulse width modulation mode, the bias current terminal for the linear drive circuit is disconnected from all discharge paths to prevent a capacitor connected to this bias terminal from discharging. The voltage on the bias terminal is maintained even though the linear drive circuit currently is not being provided with power and is not operating. At a selected time period, the circuit transitions from the PWM mode of operation back to the linear mode of operation. The voltage bias terminal has maintained the same voltage which was present when it was disabled because the node has been disconnected from all discharge paths and placed into a high impedance state. This provides the advantage that transients associated with charging and discharging of this node are avoided, and fast switching from linear mode to PWM mode and back to linear mode is possible. Further, noises associated with such switching are reduced by maintaining the bias circuit disconnected from all discharge paths when the circuit is not operating.

The invention provides a linear mode control circuit and accompanying method for promoting rapid and robust linear mode control in response to control signals for powering DC poly-phase brush-less motors. The invention also provides a circuit and an accompanying method for maintaining the charge on the bias circuit while the motor is being driven in the PWM mode.

DETAILED DESCRIPTION OF THE INVENTION

Figure 1:
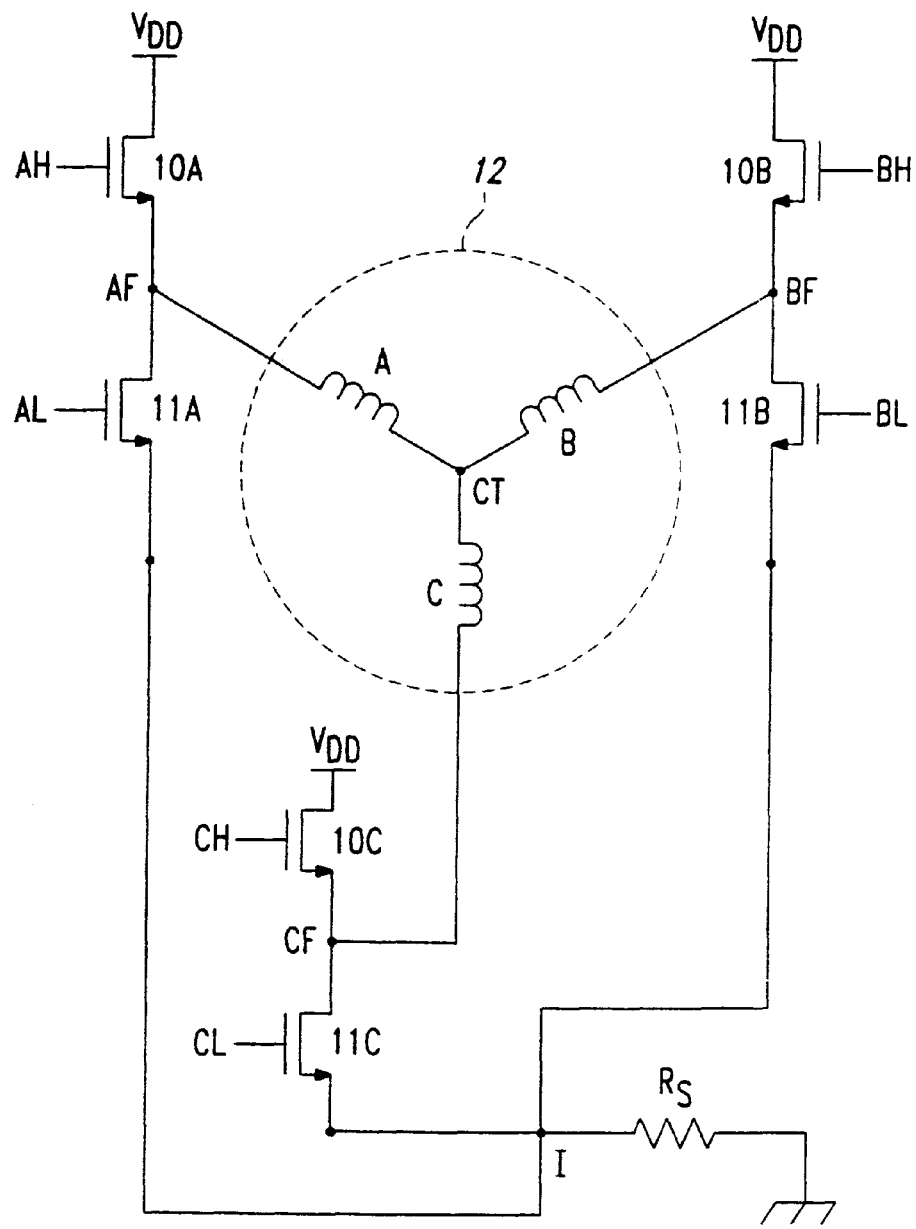
FIG. 1 is an electrical schematic diagram of a three-phase DC motor according to the prior art.

A typical three-phase "Y" coupled motor is shown schematically in FIG. 1. Three coils of the motor are identified by the letters A, B and C. A center tap end of each of the coils is coupled at a center tap CT. A rotor is shown schematically by a circle 12. The figures are not drawn to scale and it will be appreciated that the coils A, B and C are usually positioned on a stator surrounding the rotor, with the rotor having at least one N-S magnetic set attachment thereto inside the coils. Such rotor and coil assemblies are well known in the art.

Each coil is driven by a pair of n-channel lateral DMOS driving transistors, a first end of each coil being coupled to a node joining a high side driving transistor and a low side driving transistor. A first end of the coil A, denoted as AF, is coupled to the source of a high side driving transistor 10A and to the drain of a low side driving transistor 11A. A first end of the coil B, denoted as BF, is similarly coupled to the source of a high side driving transistor 10B and to the drain of a low side driving transistor 11B. Finally, a first end of the coil C, denoted as CF, is coupled to the source of a high side driving transistor 10C and to the drain of a low side driving transistor 11C. The drains of each of the high side driving transistors 10A, 10B and 10C are coupled to a voltage source $V_{DD}$, and the sources of each of the low side driving transistors 11A, 11B and 11C are coupled to a first end I of a sense resistor $R_S$. A second end of the sense resistor $R_S$ is coupled to a ground voltage reference. The coupling of the sense resistor $R_S$ to the sources of all of the low side driving transistors ensures that all of the current flowing through the coils A, B and C will pass through the sense resistor $R_S$ before returning to ground. The voltage drop across the sense resistor $R_S$ is a measure of the total current flowing in the coils A, B and C.

The gates of the high side and low side driving transistors are driven by a set of control signals generated by a motor control logic circuit. The gate of the high side driving transistor 10A is driven by a control signal AH and the gate of the low side driving transistor 11A is driven by a control signal AL. The gate of the high side driving transistor 10B is driven by a control signal BH and the gate of the low side driving transistor 11B is driven by a control signal BL. The gate of the high side driving transistor 10C is driven by a control signal CH and the gate of the low side driving transistor 11C is driven by a control signal CL. The gates of the driving transistors are selectively energized by the motor control logic circuit through the control signals AH, AL, BH, BL, CH and CL to control the path of current flowing through the coils. When a gate of one of the driving transistors is energized to a high voltage level, the driving transistor conducts current and becomes part of the current path in the motor. For example, in a representative phase of operation, current flows from coil A to coil B by flowing from the voltage source VDD, through the high side driving transistor 10A, through the coil A, the center tap CT, the coil B, and then through the low side driving transistor 11B and the sense resistor $R_S$ to the ground voltage reference. This particular phase is chosen by the motor control logic circuit by taking the AH and BL control signals high to energize the driving transistors 10A and 11B while leaving the other four control signals BH, CH, AL and CL low. A commutation is carried out by the motor control logic circuit which, at the appropriate moment, pulls one of the control signals low and simultaneously drives another of the control signals high.

When the three-phase DC motor is operated in the bipolar mode, the coils A, B and C are energized according to a sequence of phases of current flow, each phase being defined by a current path through two of the three coils with the third coil left floating. A first phase has been described above in which the driving transistors 10A and 11B are energized to create a current path. Six alternate phases of current flow are possible for the "Y" configuration of coils, and the six phases are employed in a sequence to start and maintain the rotation of the rotor. The sequence of phases is arranged so that, as each commutation occurs, one of the coils in the current path is switched to a floating condition and the previously floating coil is switched into the current path. Moreover, the sequence is chosen such that when the floating coil is switched into the current path, it replaces one of the conducting coils such that current flows in the newly conducting coil in the same direction as it had in the formerly conducting coil. For example, if current is flowing through the high side driving transistor 10A to the coil A, and the coil A is replaced by the coil B, current will then flow from the high side driving transistor 10B to the coil B.

Methods for operating three-phase DC motors are well known, and several examples are contained in U.S. Pat. Nos. 5,221,881; 5,231,338; 5,306,988; and 5,317,243. In an alternative embodiment, the three-phase DC motor may be operated with a sequence of three phases rather than six phases.

Figure 2:
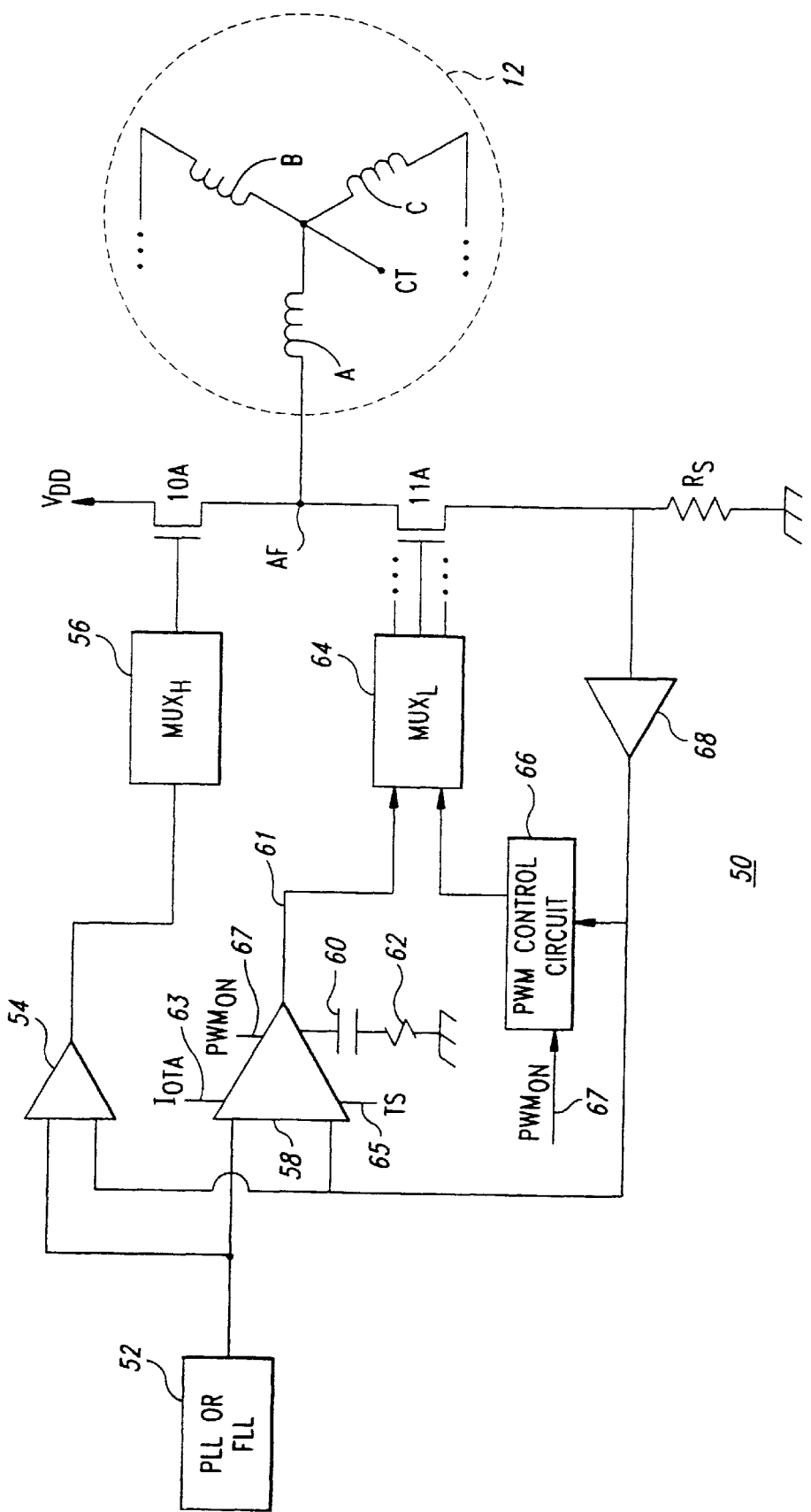
FIG. 2 is a simplified block diagram of a portion of a motor control circuit according to an embodiment of the invention.

FIG. 2 is a simplified block diagram of a portion 50 of a motor control circuit according to an embodiment of the invention. The circuit 50 includes a frequency-locked loop or a phase-locked loop circuit 52 supplying pulses to the driver in response to zero-crossing signals from the floating coil (that give the speed of the motor) via circuitry that is not illustrated in FIG. 2 but that is known in the art. The phase-locked loop 52 supplies signals whose frequency depends on the final RPM target for the motor. The phase-locked loop 52 supplies pulses to a first input of a comparator 54 and to a first input of a transconductance operational amplifier 58. The comparator 54 and the transconductance operational amplifier 58 each have a second input coupled to an output of a sense buffer amplifier 68. The comparator 54 includes an output coupled to an input of multiplexer $MUX_H$ 56. The multiplexer $MUX_H$ 56 has outputs coupled to drive transistors 10A–10C, shown in FIGS. 1 and 2 as MOS transistors, but which may be realized in any convenient form.

The sense buffer amplifier 68 is realized, in one embodiment, as an operational amplifier configured to provide a constant gain (e.g., four for example) and having an input coupled to the sense resistor $R_S$. The sense buffer amplifier 68 also provides an output signal to a PWM control circuit 66. In one embodiment, the comparator 54 is included as a subassembly of the PWM control circuit 66. The comparator 54, buffer amplifier 68 and PWM control circuit 66 are of a type well known in the art and any known circuits of these types are acceptable for use as these components.

The transconductance operational amplifier 58 includes a bias circuit comprising a capacitor 60 and an optional resistor 62. The bias circuit removes high frequency signals from the control loop and protects the power devices from voltage spikes in the linear mode of operation. In one embodiment, the capacitor 60 is not on the integrated circuit and is realized as a tantalum capacitor having a value in a range of one to fifty nanoFarads with ten to twenty nanoFarads being preferred.

The transconductance operational amplifier 58 has an output 61 coupled to a multiplexing circuit $MUX_L$ 64. The multiplexing circuit $MUX_L$ 64 has a second input coupled to the PWM control circuit 66 and responds to the input signals by coupling the appropriate one of those signals to appropriate drive transistors 11A–11C, shown in FIGS. 1 and 2 as MOS transistors, but which may be realized in any convenient form. Such multiplexers and the control signals for them are well known in the art and the details need not be shown.

The transconductance operational amplifier 58 also includes a bias input $I_{OTA}$ 63, a tristate input 65 and a control input 67 labeled $PWN_{ON}$. The tristate input 65 is employed in operations such as braking the motor. Setting the tristate input TS high results in rapid discharge of the capacitor 60 and sets the output of the transconductance operational amplifier 58 to a low value such as ground. The current bias input 63 supplies bias current, typically about 20 microamperes, to the amplifiers contained within transconductance operational amplifier 58.

In operation, the circuit 50 normally is in pulse width modulation mode for most of each cycle or for one revolution of the motor. PWM is preferred because it allows the circuit 50 to operate with least power dissipation in the drive transistors 10A–10C and 11A–11C. However, switching noise generated by the pulses interferes substantially with the measurement of the zero crossings and other aspects of circuit operation. Accordingly, it is desirable to switch over to linear control mode for a period encompassing the zero crossing. There are other times when switching from PWM control mode to linear control mode is desired, depending on the system.

When the circuit 50 switches to linear mode, it is highly desirable that the capacitor 60 be pre-charged to an appropriate operating voltage. Prior art designs achieved this by incorporating a switch within the transconductance operational amplifier that isolated the capacitor 60 from the internal components of the transconductance operational amplifier 58. Such a switch may have a higher resistance than desired, as well as a voltage drop that requires use of a larger capacitor 60. In order to have a low on resistance, the switch needed to be realized as a fairly large transistor, which cost area and speed and which created noise of its own. Additionally, in some applications, optional resistor 62 is not employed, but it is not possible to eliminate the "ON" resistance of such a switch.

Figure 3:
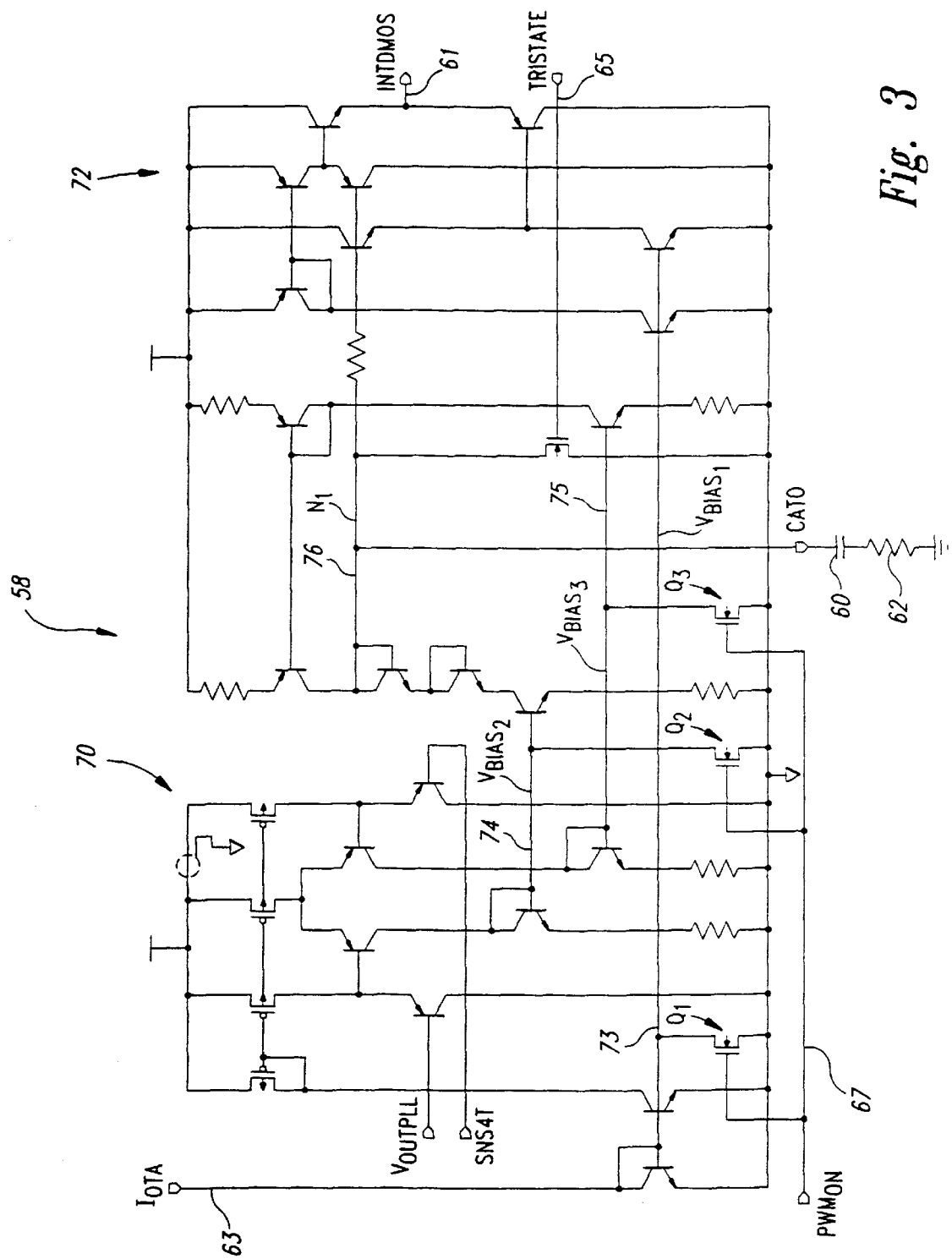
FIG. 3 is a simplified schematic diagram of an amplifier for a motor control circuit according to an embodiment of the invention.

FIG. 3 is a schematic diagram of the transconductance operational amplifier 58 of FIG. 2 according to an embodiment of the invention. The transconductance operational amplifier 58 includes a first differential amplifier 70, an output amplifier 72 and a node 76 coupled to the output of the amplifier 70 and the input of the amplifier 72. The amplifiers 70 and 72 include biasing lines 73, 74 and 75. The currents to the amplifiers 70 and 72 are set by signal levels present on these biasing lines. The biasing lines 73–75 are each coupled to a drain of a transistor $Q_1$, $Q_2$ and $Q_3$, respectively. The transistors $Q_1$, $Q_2$ and $Q_3$ each have a source terminal coupled to ground and a gate terminal coupled to a signal line labeled $PWM_{ON}$ 67. When the signal line labeled $PWM_{ON}$ 67 is driven to a logical ONE, i.e., a positive voltage, transistors $Q_1$–$Q_3$ are turned on, coupling biasing lines 73–75 to ground via a low impedance. This in turn sets the base currents of the transistors biased via the biasing lines 73–75 to zero or near zero. This causes an extremely high impedance, also manifested as an extremely low leakage current, between the node 76 and ground. As a result, the capacitor 60 switches from having a first discharge time constant $\tau_1$ (in linear mode) to having a second discharge time constant $\tau_2$ (in PWM mode), with the second time constant $\tau_2$ being much longer than the first time constant $\tau_1$. In other words, the paths that could change the voltage stored on the capacitor 60 are substantially reduced when the bias to the amplifiers 70 and 72 is shut off via signals present on the $PWM_{ON}$ line 67.

The leakage currents present in the amplifiers 70 and 72 tend to be dominated by the leakage currents associated with the bipolar transistors, due to the relatively large area that they occupy on the die. In one preferred embodiment, the amplifier 72 includes a class AB bipolar push-pull output stage. By isolating these transistors to prevent leakage through them, the charge on the capacitor 60 is maintained at its present level for a long time.

When the transconductance operational amplifier 58 is needed for linear control of the motor 12, the signal on the $PWM_{ON}$ line 67 is driven low, re-establishing bias to the differential input amplifier 70 and the output amplifier 72. The node 76 has been held at its prior voltage level and is thus already charged to the appropriate voltage because the currents leaking charge off of the capacitor 60 have been minimized during the interval that the circuit was operating in PWM mode.

Figure 4:
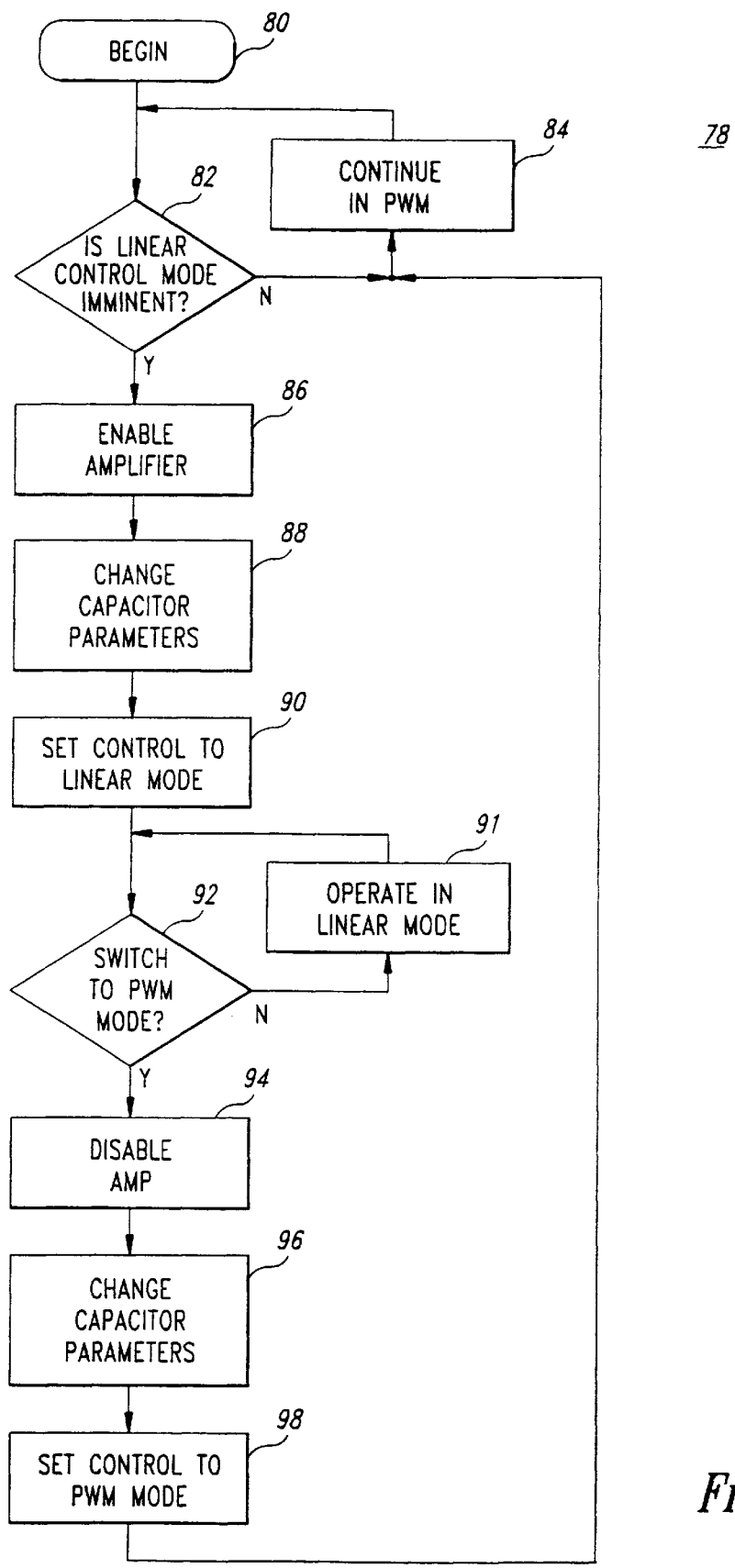
FIG. 4 is a flow chart illustrating steps according to an embodiment of the invention.

FIG. 4 is a flow chart illustrating steps in a process 78 for operating a direct current poly-phase motor according to an embodiment of the invention. The process 78 begins in step 80 with a query task 82 to determine if a switch to linear control mode is imminent. This could, for example, be a zero cross point which can be predicted as described by many prior publications. When a control mode switch is not imminent, the process 78 continues to operate the motor in pulse width modulation mode in step 84 and control passes back to the query task 82. When a control mode switch is determined to be imminent in the query task 82, control passes to a step 86 to enable the amplifier used to output linear control signals.

The parameters (i.e., leakage current or time constant) associated with a capacitor 60 coupled to the amplifier are modified in step 88 and the controller outputs a signal to turn off PWM mode and to operate the motor in the linear mode in step 90. A query task 92 then determines whether a switch back to PWM mode is desired, such as whether a zero crossing has taken place or not. If no, the controller continues to operate in linear mode in step 91 and control passes back to the query task 92. When the switching is desired, such as a zero crossing having occurred, the amplifier is disabled in step 94 and the capacitor parameters are changed in step 96 to isolate node 76 to a high impedance state. This will ensure an increased time constant/decreased leakage current for the capacitor 60. Control is set to operate in the pulse width modulation mode in step 98 and the process 78 then returns to step 84.

A method and circuits for rapidly and reliably initiating linear drive parameters following a period of pulse width modulation control of a poly-phase DC motor have been described. In the preceding description, specific details were set forth, such as a specific arrangement of amplifiers, capacitors and the like in order to provide a thorough understanding of embodiments of the present invention. It will be apparent, however, to one skilled in the art that the present invention may be practiced without these details. In other instances, well-known circuits such as a motor control logic circuit, a sequencer circuit and a phase- or frequency-locked loop circuit have not been shown in detail in order to provide clarity and ease of understanding.

It will also be appreciated that, although various embodiments of the invention have been described above for purposes of illustration, various modifications may be made without deviating from the spirit and scope of the invention. For example, the present invention has been described as using a first capacitor external to the linear mode control chip. However, those skilled in the art will appreciate that the present invention could be practiced with alternative circuitry for providing a capacitor, for example, on chip. Also, the present invention has been described in relation to a three-phase DC motor being operated in a sequence of six phases. The present invention is equally applicable to other poly-phase DC motor operation modalities. Numerous variations are well within the scope of this invention. Accordingly, the invention is not limited except as by the appended claims.

What is claimed is:

1. A method comprising:
    activating a disable circuit coupled to a disable terminal of an amplifier, the amplifier having a first input terminal, a second input terminal, an output terminal, and a voltage bias terminal;
    placing the voltage bias terminal in a high impedance state, to maintain a voltage on a capacitor coupled to said voltage bias terminal;
    deactivating said disable circuit; and placing the voltage bias terminal in a second state, to couple said voltage bias terminal to a power source for charging or discharging said capacitor.

2. The method as claimed in claim 1, further including:
coupling the first input terminal to a drive signal for motor speed control.

3. The method as claimed in claim 1, further including:
coupling both terminals of said capacitor to ground in response to a braking control signal.

4. A circuit comprising:
a differential input amplifier having a first input responsive to a first voltage, a second input responsive to a second voltage and having an output coupled to a first node;
a transconductance operational amplifier having an input responsive to voltage signals coupled to said first node and an output providing a voltage signal;
a bias circuit coupled from said first node to a power supply lead; and
another circuit to disable said differential input amplifier and said transconductance operational amplifier and to provide a high DC impedance between said first node and said power supply lead in response to a control signal, which provides for a linear mode of operation in a first state and a pulse width mode of operation in a second state.

5. The circuit as claimed in claim 4, further comprising:
a sense amplifier having an input responsive to a total current to a motor and having an output coupled to said differential input amplifier;
a high side multiplexing circuit coupled to said output of said sense amplifier through a comparator, said high side multiplexing circuit being structured to commutate control signals from said comparator between high side drive transistors coupled to said motor;
a pulse width modulation control circuit having a first input coupled to said sense amplifier output and having an output; and
a low side multiplexing circuit having a first input coupled to said transconductance operational amplifier and having a second input coupled to said output of said pulse width modulation control circuit, said low side multiplexing circuit being structured to commutate control signals from either said transconductance operational amplifier or said output of said pulse width modulation control circuit between low side drive transistors coupled to said motor.

6. The circuit as claimed in claim 4, wherein said bias circuit comprises a capacitor.

7. The circuit as claimed in claim 6, wherein said capacitor is external to an integrated circuit comprising said differential input amplifier and said transconductance operational amplifier.

8. The circuit as claimed in claim 4, wherein said differential input amplifier and said transconductance operational amplifier comprise an integrated circuit.

9. The circuit as claimed in claim 4, wherein said transconductance operational amplifier includes a bipolar push-pull output stage.

10. The circuit as claimed in claim 4, further comprising:
a frequency-locked loop having an output coupled to said first input of said differential input amplifier, said frequency-locked loop output providing control signals;
a first plurality of drive transistors;
a first multiplexer having an input coupled to said output of said transconductance operational amplifier, said first multiplexer coupling signals from said transconductance operational amplifier to control electrodes of said first plurality of drive transistors to provide a first multiphase drive signal;
a sense resistor coupled to a first electrode of each of said first plurality of drive transistors;
a buffer amplifier having an input coupled to said sense resistor and said first electrode of each of said first plurality of drive transistors and an output coupled to said second input of said differential input amplifier;
a comparator having a first input coupled to said output of said frequency-locked loop, a second input coupled to said output of said buffer amplifier and an output;
a second plurality of drive transistors, each having a first electrode coupled to a second electrode of said first plurality of drive transistors and having second electrodes coupled to a power supply line; and
a second multiplexer circuit having an input coupled to said output of said comparator, said second multiplexer coupling signals from said transconductance operational amplifier to control electrodes of said second plurality of drive transistors to provide a second multiphase drive signal.

11. An apparatus comprising:
an amplifier having a first node and a disable terminal coupled to a disable circuit; and
a capacitor having a first lead coupled to said first node and a second lead coupled to a power supply lead, wherein, in response to a first state of a control signal corresponding to a linear operation of the apparatus, said amplifier is enabled and said first node assumes a first impedance such that said capacitor charges and discharges with a first time constant, and in response to a second state of the control signal corresponding to a pulse width modulation operation of the apparatus, said amplifier is disabled by the disable circuit and said first node assumes a high impedance such that a charge on said capacitor is substantially maintained so that said capacitor charges and discharges with a second time constant longer than said first time constant.

12. The apparatus as claimed in claim 11, wherein said amplifier comprises:
a first differential amplifier having a first input responsive to a first voltage, a second input responsive to a second voltage and having an output coupled to said first node; and
a second amplifier having an input coupled to said first node and providing an output signal at an output node.

13. The apparatus as claimed in claim 12, further comprising:
a frequency-locked loop having an output coupled to said first input of said first differential amplifier, said frequency-locked loop output providing control signals;
a first plurality of drive transistors;
a first multiplexer having an input coupled to said output node of said second amplifier, said first multiplexer coupling signals from said second amplifier to control electrodes of said first plurality of drive transistors to provide a first multiphase drive signal;
a sense resistor coupled to a first electrode of each of said first plurality of drive transistors;
a buffer amplifier having an input coupled to said sense resistor and said first electrode of each of said first plurality of drive transistors and an output coupled to said second input of said first differential amplifier;

a comparator having a first input coupled to said output of said frequency-locked loop, a second input coupled to said output of said buffer amplifier and an output;

a second plurality of drive transistors, each having a first electrode coupled to a second electrode of said first plurality of drive transistors and having second electrodes coupled to a power supply line; and a second multiplexer circuit having an input coupled to said output of said comparator, said second multiplexer coupling signals from said second amplifier to control electrodes of said second plurality of drive transistors to provide a second multiphase drive signal.

14. A circuit comprising:

means for enabling a bias current to an amplifier in response to a first control signal and setting a time constant of a capacitor comprising a part of a bias circuit coupled to said amplifier to a first value;

means for disabling said bias current to said amplifier in response to a second control signal and setting a time constant of said capacitor to a second value substantially greater than said first value; and means for substantially reducing leakage current between a node coupled to said capacitor and ground to thereby reduce paths that could change a voltage stored on said capacitor, such that said capacitor is charged to an appropriate operating voltage if said bias current is enabled in response to said first control signal.

15. The circuit as claimed in claim 14, further comprising:

means for operating a drive circuit for a poly-phase direct current motor in a pulse width modulation mode;

means for determining that a zero crossing will occur within a predetermined interval; and means for providing said first control signal in response to determining that said zero crossing will occur.

16. The circuit as claimed in claim 15, further comprising:

means for changing an operating state of said drive circuit from said pulse width modulation mode to a linear mode in response to said first control signal;

means for determining that said zero crossing has occurred;

means for providing said second control signal in response to determining that said zero crossing has occurred; and means for changing said operating state of said drive circuit from said linear mode to said pulse width modulation mode in response to said second control signal.

17. The circuit as claimed in claim 14, wherein disabling said bias current includes switching a node within said amplifier having a capacitor coupled thereto to a low leakage current state.

18. The circuit as claimed in claim 14, wherein enabling a bias current to an amplifier includes enabling said amplifier.

19. The circuit as claimed in claim 14 wherein disabling a bias current to an amplifier includes disabling said amplifier.

* * * * *